(12) United States Patent
Hutton et al.

(10) Patent No.: US 8,185,854 B1
(45) Date of Patent: May 22, 2012

(54) METHOD AND APPARATUS FOR PERFORMING PARALLEL SLACK COMPUTATION WITHIN A SHARED NETLIST REGION

(75) Inventors: Michael D. Hutton, Mountain View, CA (US); Jason Govig, San Jose, CA (US)

(73) Assignee: Altera Corporation, San Jose, CA (US)

( * ) Notice: Subject to any disclaimer, the term of this patent is extended or adjusted under 35 U.S.C. 154(b) by 307 days.

(21) Appl. No.: 12/544,970

(22) Filed: Aug. 20, 2009

Related U.S. Application Data

(63) Continuation-in-part of application No. 11/603,563, filed on Nov. 22, 2006, now Pat. No. 7,725,856.

(51) Int. Cl.
*G06F 17/50* (2006.01)

(52) U.S. Cl. ........ 716/108; 716/113; 716/105; 716/134; 703/16

(58) Field of Classification Search .................. 716/108, 716/113, 105, 134; 703/16
See application file for complete search history.

(56) References Cited

U.S. PATENT DOCUMENTS

| | | | | |
|---|---|---|---|---|
| 6,256,766 | B1 * | 7/2001 | Luo ............................... | 716/114 |
| 6,311,313 | B1 * | 10/2001 | Camporese et al. .......... | 716/113 |
| 6,523,155 | B1 * | 2/2003 | Ruedinger .................... | 716/103 |
| 6,550,045 | B1 * | 4/2003 | Lu et al. ........................ | 716/114 |
| 7,472,365 | B1 * | 12/2008 | Manaker, Jr. ................. | 716/113 |
| 7,584,443 | B1 * | 9/2009 | Govig et al. .................. | 716/113 |
| 7,594,204 | B1 * | 9/2009 | Singh et al. ................... | 716/132 |
| 7,720,107 | B2 * | 5/2010 | Bhattacharya et al. ....... | 370/503 |
| 7,725,856 | B1 * | 5/2010 | Govig et al. .................. | 716/124 |
| 7,761,828 | B2 * | 7/2010 | Miczo ........................... | 716/103 |
| 2008/0046851 | A1 * | 2/2008 | Miczo .............................. | 716/7 |
| 2008/0134117 | A1 * | 6/2008 | Kalafala et al. .................. | 716/6 |
| 2008/0216040 | A1 * | 9/2008 | Furnish et al. ................. | 716/10 |
| 2008/0301593 | A1 * | 12/2008 | Jiang et al. ....................... | 716/2 |
| 2008/0301594 | A1 * | 12/2008 | Jiang et al. ....................... | 716/2 |
| 2009/0254874 | A1 * | 10/2009 | Bose ................................. | 716/6 |
| 2010/0180240 | A1 * | 7/2010 | Davis et al. ...................... | 716/5 |

* cited by examiner

*Primary Examiner* — Phallaka Kik
(74) *Attorney, Agent, or Firm* — L. Cho

(57) ABSTRACT

A method for designing a system on a target device is disclosed. Domains and sub-domains in the system are identified. A sub-domain is divided into a plurality of chunks. Slacks for the chunks are computed in parallel. Other embodiments are described and claimed.

32 Claims, 10 Drawing Sheets

PARTITIONING-BASED SUB-DOMAIN DIVISION

METHOD AND APPARATUS FOR PERFORMING PARALLEL SLACK COMPUTATION WITHIN A SHARED NETLIST REGION

RELATED APPLICATIONS

This application is a continuation-in-part of and claims the benefit under Title 35 United States Code, Section 120 of U.S. application Ser. No. 11/603,563, now U.S. Pat. No. 7,725,856, filed on Nov. 22, 2006 entitled "Method and Apparatus for Performing Parallel Slack Computation".

FIELD

Embodiments of the present invention relate to electronic design automation (EDA) tools. More specifically, embodiments of the present invention relate to a method and apparatus for performing parallel slack computations within a shared netlist region.

BACKGROUND

Electronic designs for large systems may include millions of gates and megabits of embedded memory. Of the tasks required in managing and optimizing electronic designs on a target device, synthesis, placement, and routing utilizing available resources can be among the most challenging and time consuming. The complexity of large systems often requires the use of electronic design automation (EDA) tools to manage and optimize designs. EDA tools perform the time-consuming tasks of synthesis, placement, and routing on a target device.

Some EDA tools also performing timing analysis on a design. The timing analysis may be performed after synthesis, placement, and/or routing in order to confirm that the design for the system meets timing requirements. Timing analysis may also be performed after synthesis, placement, and/or routing in order to evaluate solutions generated by one or more of the procedures. The results from timing analysis may be used to re-run one or more of the procedures in efforts to improve a solution. The main task of timing analysis is the computation of slack values. Slack may be defined as the difference between a data arrival time and a data required time.

The procedures used for computing slack values for a design may require a significant amount of processor execution time. When timing analysis is used to compute slack for a plurality of stages in the design flow, significant delays may be incurred in the design process.

BRIEF DESCRIPTION OF THE DRAWINGS

The features and advantages of embodiments of the present invention are illustrated by way of example and are not intended to limit the scope of the embodiments of the present invention to the particular embodiments shown.

SUMMARY

According to an exemplary embodiment of the present invention, a timing analysis unit identifies a plurality of domains and sub-domains from a netlist for a design of a system. A sub-domain may be further divided into a plurality of chunks to be processed to compute slack values. The sub-domain may be divided by common clock path pessimism groups and/or by hierarchical levels of destination registers. Threads supported by a multi-processor or multi-core system are each assigned a chunk to be processed in parallel. By performing slack computations in the chunks in parallel, improved runtime performance is achieved.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
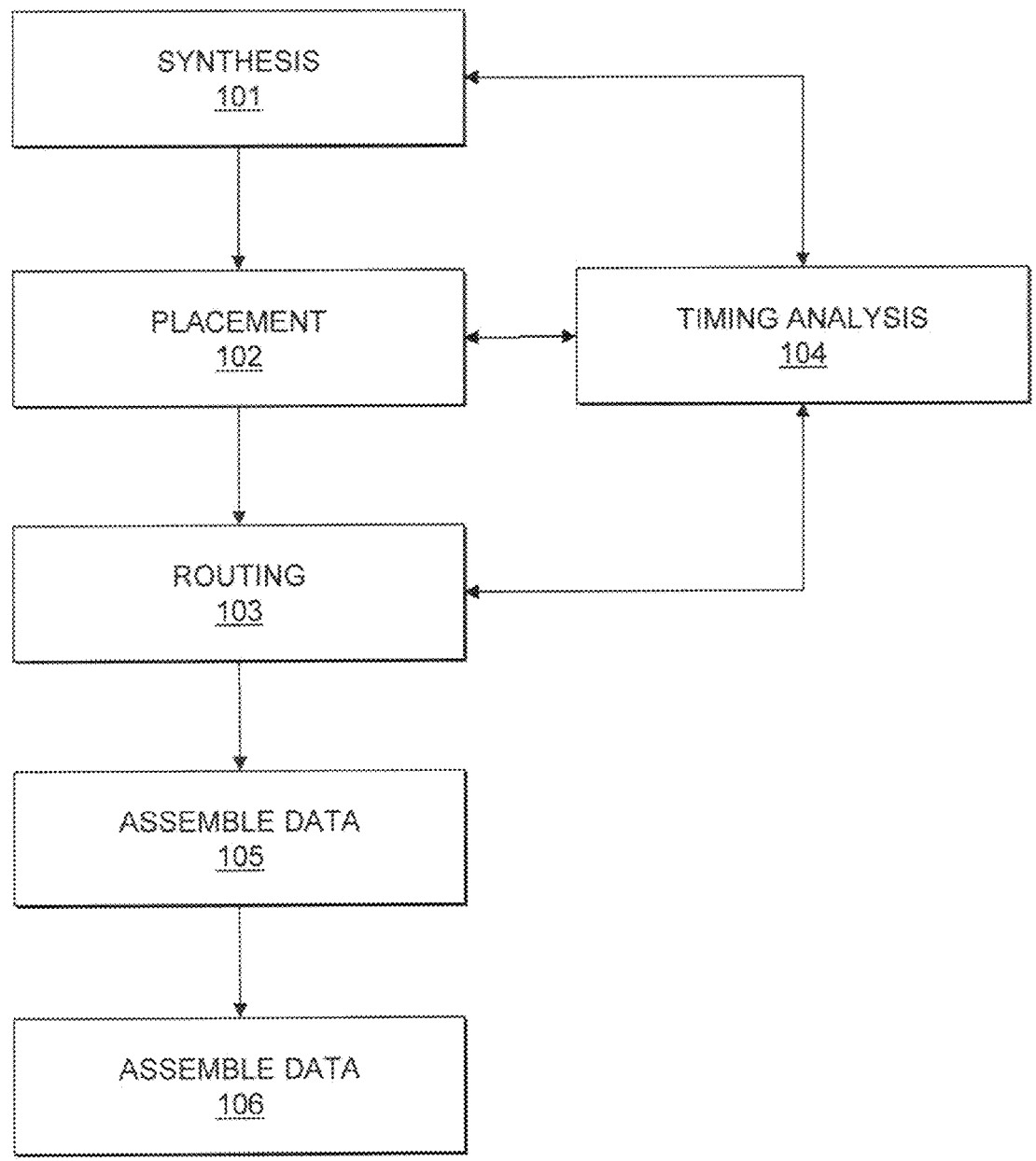
FIG. 1 is a flow chart illustrating a method for designing a system according to an exemplary embodiment of the present invention.

FIG. 1 is a flow chart illustrating a method for designing a system on a target device according to an exemplary embodiment of the present invention. The target device may be an FPGA, ASIC, a structured ASIC, or other device. At 101, the system is synthesized. Synthesis includes generating a logic design of the system to be implemented. According to an embodiment of the present invention, synthesis generates an optimized logical representation of the system from a HDL design definition. The optimized logical representation of the system may include a representation that has a minimized number of functional blocks and registers, such as logic gates and logic elements, required for the system. Synthesis also includes mapping the optimized logic design (technology mapping). Mapping includes determining how to implement logic gates and logic elements in the optimized logic representation with resources (components) available on the target device. According to an embodiment of the present invention, a netlist is generated from mapping. This netlist may be an optimized technology-mapped netlist generated from the HDL.

At 102, the mapped logical system design is placed. Placement works on the optimized technology-mapped netlist to produce a placement for each of the functional blocks. According to an embodiment of the present invention, placement includes fitting the system on the target device by determining which components on the logic design are to be used for specific logic elements, and other function blocks determined to implement the system as determined during synthesis. Placement may include clustering which involves grouping logic elements together to form the logic clusters present on the target device.

At 103, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 104, static timing analysis (STA) is performed on various portions of the system. Timing analysis may include the computation of slack for the various portions on the system. The slack may be used to compute setup, hold, recovery, removal, and other types of timing requirements. According to one embodiment, slack may refer to the difference between the data arrival time (including skew and microparameters) and the data required time. The slack may be computed after synthesis, placement, or routing in order to confirm that the design for the system meets timing requirements and/or to evaluate solutions generated by the synthesis, placement, or routing. The results generated from slack computation may be used to re-run one or more of the procedures performed for synthesis, placement, and/or routing in efforts to improve a solution. Physical synthesis may additionally be performed in response to timing analysis. Physical synthesis is a procedure that may be performed after or at the end of placement where individual cells of netlists may be duplicated, locally resynthesized or restructured. According to an embodiment of the present invention, domains and sub-domains in the system are identified. If a sub-domain exceeds a threshold, the sub-domain may be partitioned. Chunks are defined from the domains, sub-domains, and sub-domain partitions. Slack values may be computed in parallel by distributing the chunks to threads supported by one or more processors or processor cores.

At 105, an assembly procedure is performed. The assembly procedure involves creating a data file that includes information determined by the compilation procedure described by 401-404. The data file may be a bit stream that may be used to program a target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

At 106, the target device is programmed with the data file. By programming the target with the data file, components on the target device are physically transformed to implement the system. According to an embodiment of the present invention where the target device is an ASIC or other target device other than an FPGA, procedures 105 and 106 may not be performed.

Figure 2:
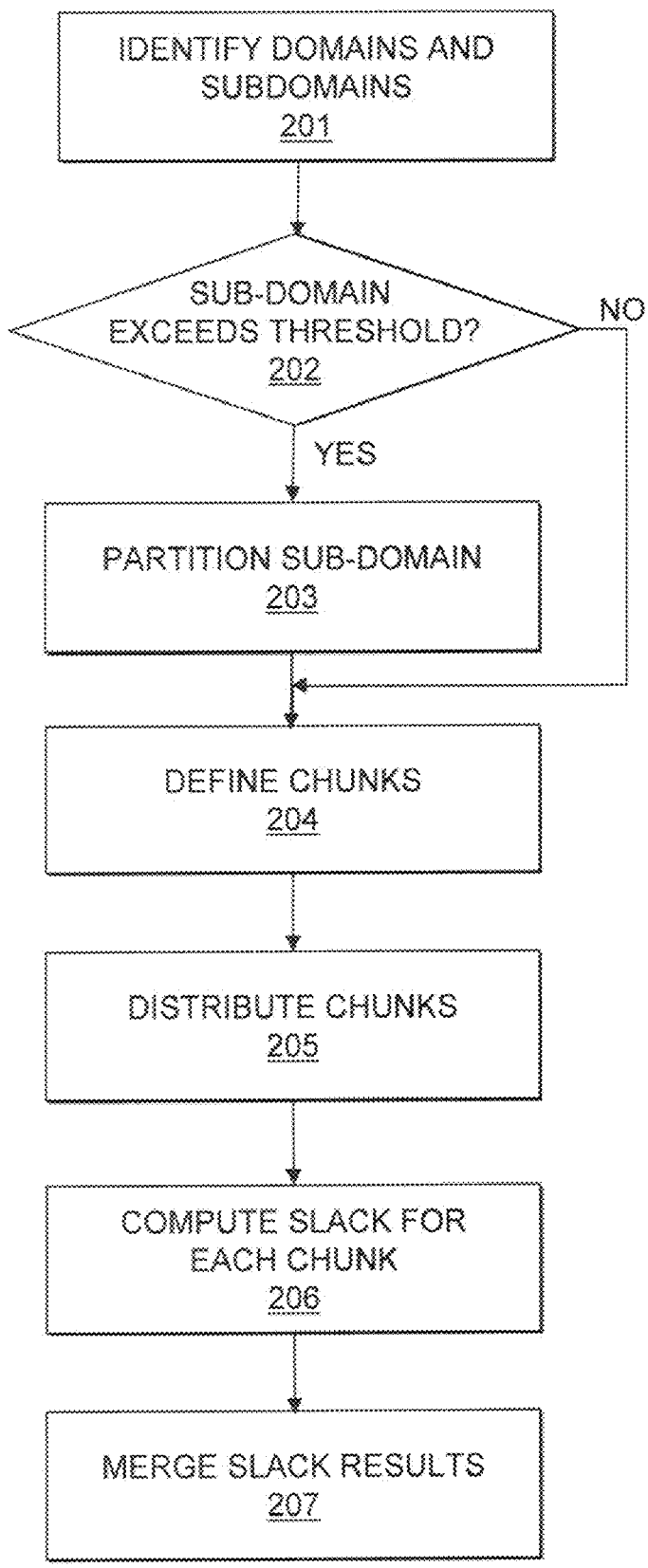
FIG. 2 is a flow chart illustrating a method for performing timing analysis according to an exemplary embodiment of the present invention.

FIG. 2 is a flow chart illustrating a method for performing timing analysis according to an embodiment of the present invention. Inputs to the flow include a hardware description language (e.g. VHDL or Verilog) description of a hardware design, or a partially synthesized netlist, along with one or more constraint specifying files. Constraints, such as the required clock period for a given clock, the relationship between clocks, exceptions such as multicycles and false paths are commonly provided in the specification languages such as the Synopsys Design Constraint (SDC) format. The procedure illustrated in FIG. 2 may be used to implement procedure 104 illustrated in FIG. 1. At 201, domains and sub-domains are identified. According to an embodiment of the present invention, a netlist and a design constraint file are parsed to identify domains and sub-domains. The net list may be generated after synthesis, placement, or routing. According to an embodiment of the present invention, a domain may include a plurality of components (represented by nodes) and connections interconnecting the components that are driven by a single clock in a system. A sub-domain may include a path through a subset of the components and connections that are sourced by another domain. The sub-domain may include a subset of nodes and connections that are associated with a second clock. Sub-domains may be identified as portions of a network having constraints or exceptions. For example, a sub-domain may include a path through a subset of the nodes and connections that are subject to minimum and/or maximum delay constraints or a portion of a netlist that is not subject to any constraints (false path or cut path). Other timing exception may also be identified. A multi-cycle k exception defines for a certain set of source and sink nodes that constraint on paths between the source and sink nodes is relaxed from 1 clock period to k clock periods. A thru-X-multi-cycle k exception specifies that a multi-cycle exception applies to a set of source and sink registers with the addition of applying only to paths which pass through the set of nodes in X. In addition, constraints on arbitrary source-destination paths may be defined, either as exceptions or as constraints. It should be appreciated that a domain and sub-domain may alternatively be defined by other characteristics.

At 202, each of the sub-domains identified are analyzed to determine whether its size exceeds a threshold. According to an embodiment of the present invention, the threshold may be a measurement value. Alternatively, the threshold may be a ratio that compares a size of a sub-domain to a size of the system or part of the system. If a sub-domain exceeds the threshold, control proceeds to 203 to perform an appropriate procedure on the sub-domain that exceeds the threshold. If the sub-domain does not exceed the threshold, control proceeds to 204 to perform an appropriate procedure on the sub-domain that does not exceed the threshold.

According to an embodiment of the present invention, the threshold may be dynamically adjusted. For example, the procedure may track the sizes of sub-domains. In order to generate a balanced work list, the procedure may modify the threshold in order to balance and improve work fragmentation.

At 203, the sub-domain is partitioned. According to an embodiment of the present invention, the sub-domain may be partitioned by common clock path pessimism (CCPP) groups. Alternatively, the sub-domain may be partitioned by partitioning destination registers into levels of hierarchy. It should be appreciated that other partitioning procedures and techniques may also be utilized and that a plurality of procedures and techniques may be utilized together to partition the sub-domain.

At 204, chunks are defined from the domains, sub-domains, and partitioned sub-domains identified. According to an embodiment of the present invention a chunk may be defined to include an entire domain and all sub-domains associated with it. A chunk may be defined to include only a sub-domain. A chunk may also be defined to include a partition (sibling) of a sub-domain. The definition of each chunk may be made according to properties of a particular domain, sub-domain, or partition of a sub-domain, such as its size.

At 205, the chunks are distributed. According to an embodiment of the present invention, the chunks may be assigned to available thread supported by a computer system. The threads may be executed in parallel to allow slack computation to be performed in parallel. According to an embodiment of the present invention, the sizes of chunks are evenly distributed among available threads such that no single thread receives successive large chunks. The sizes of each chunk may be evaluated and compared with another threshold value.

At 206, slack is computed for each of the chunks. According to an embodiment of the present invention, for each chunk two depth first searches are performed. During the first depth first search, data arrival times are calculated by adding the delays associated for each connection starting from the source nodes and ending at the destination nodes. During a second depth first search, data required times are calculated by subtracting the delays associated for each connection starting from the destination nodes and ending at the source nodes. The slack for any given edge is the computed as the difference between the data arrival and data required times at that edge. Slack computation for a path may also involve selecting a slack value from a plurality of slack values computed for a connection. In one embodiment, the worst case slack value is selected. It should be appreciated that other techniques and procedures may be utilized to compute slack.

At 207, slack results for the chunks are merged. Merging may be performed by utilizing an available thread to merge completed results while other chunks are still being processed. Alternatively, merging may be performed by an available thread after all results from chunks have been processed.

According to an embodiment of the present invention, redundant sub-domains may be implemented for the purpose of testing correctness and sequential equivalence. For example, the procedure may from time to time assign a sub-domain to a thread and also partition the sub-domain into a plurality of siblings and assign the siblings to threads for processing. The slack results from the sequential and parallel processing of the sub-domain may be compared to confirm correctness of computation.

Referring to procedure 203, a sub-domain may be partitioned according to CCPP groups. CCPP is a type of pessimism due to common clock paths feeding both source and destination registers of timing paths. In order to remove CCPP, CCPP groups are identified. A CCPP group includes a set of source registers S, a set of destination registers D, and a CCPP clock node (referred to as a dominator) such that the CCPP clock node is the nearest common ancestor node in a clock tree between any source register in S and any destination register in D. The creation of CCPP groups enables analysis time reduction since only one timing calculation is required for the CCPP group instead of requiring an analysis for each possible pair of registers.

According to one aspect of the present invention, CCPP groups may be enumerated using a linear traversal method. In this embodiment, two CCPP groups are identified per clock node, except for the root node where only one CCPP group is identified. It should be noted that one of the CCPP groups enumerated per node does not include the node being examined by its parent. The first CCPP group includes the node being examined, and the source register groups (SRG) and all destination registers (ADR) of the node being examined. The second enumeration of the linear traversal method defines a CCPP group that includes the part of the node being examined, the ASR of the node being examined, and the nodes in ADR(parent) not present in ADR(node being examined). The destination registers in the CCPP group is the result of "subtracting" from the ADR(parent) the nodes in the ADR(node being examined). Because the root node does not have a parent, only one enumeration is possible when examining the root node, but the root node will be included in the CCPP groups enumerated when examining the root's children.

According to a second aspect of the present invention, CCPP groups may be enumerated using an N*Log N enumeration method. In this embodiment, all the CCPP groups that include SRG of a given node are calculated in one pass. Given a node, the CCPP group that includes the node, the SRG(node) and the ADR(node) are enumerated first. The routine "climbs" up the tree and enumerates a CCPP group for the parent of the current node, the SRG(original node), and the destination register resulting from subtracting the ADR (parent of current node)–ADR(current node) The routing continues climbing and enumerating groups until reaching the root node.

Procedures 201, 203-205, and 207 may be illustrated in part with the following pseudo code.

```
For each pos/neg destination clock domain
    For each source clock domain
        For each exception type
            Compute source & sink registers
            Compute_ccpp_groups( )
            For each CCPP_GROUP
    Queue a SUBDOMAIN_DATA work-order
    Wait for threads to complete.
    Perform appropriate merging of sub-domains into domain-slack,
        or passing on to the placement algorithm, as appropriate to the
        context used for this STA call.
While the SUBDOMAIN_DATA queue is not empty
    Pop( ) a work-order from the work-queue.
    RESULT = Compute slack on the subdomain.
    Store RESULT in the RESULT_HASH, marked
        incomplete
    Search RESULT_HASH for matching completed
        results
    If found
        Merge self to matching incomplete result R,
            but combining the two edge-caches
            into the sibling
        Mark self.complete
        Decrement R.counter
        Mark self complete, clean up memory, etc.
        If subdomain is now complete (R.counter == 0)
            Store the resulting slacks to the
                subdomain structure
            Mark R complete
        Else
            Do nothing (more merging to come)
    Else
        Set self.counter to the number of siblings of
            this subdomain.
    Exit( )
```

With reference to the pseudo code listed above, each of the CCPP groups is processed independently. The worst-case slack for every edge in a sub-domain is computed so that edge slacks are returned to a placement procedure or reported to a user in a results file. CCPP groups addition is performed to compute sub-domain slack in a context of a given CCPP relationship so not to be pessimistic and report a slack value that is too low or report a failing when timing is actually acceptable. Merging is performed on slacks on "edge e on paths between R1 and R2 in a subdomain S using CCPP relationships C1 between R1 and R2" and "edge e on paths R1 to R3 in the same sub-domain S using CCPP relationship C2 between R1 and R3" by computing the worst-case result and reporting that one as the slack on e for this sub-domain S.

Storing the RESULT is performed in order to allow reporting the final edge slack on edge e when a CCPP group is still being processed by a different thread. To facilitate merging, a RESULT data-structure may be utilized that includes a CCPP group ID of a computation, a counter of a number of CCPP groups completed, a "completed" flag, and a cache of edges computed and their slack and a RESULT_STORE which includes results processed to date.

Figure 3:
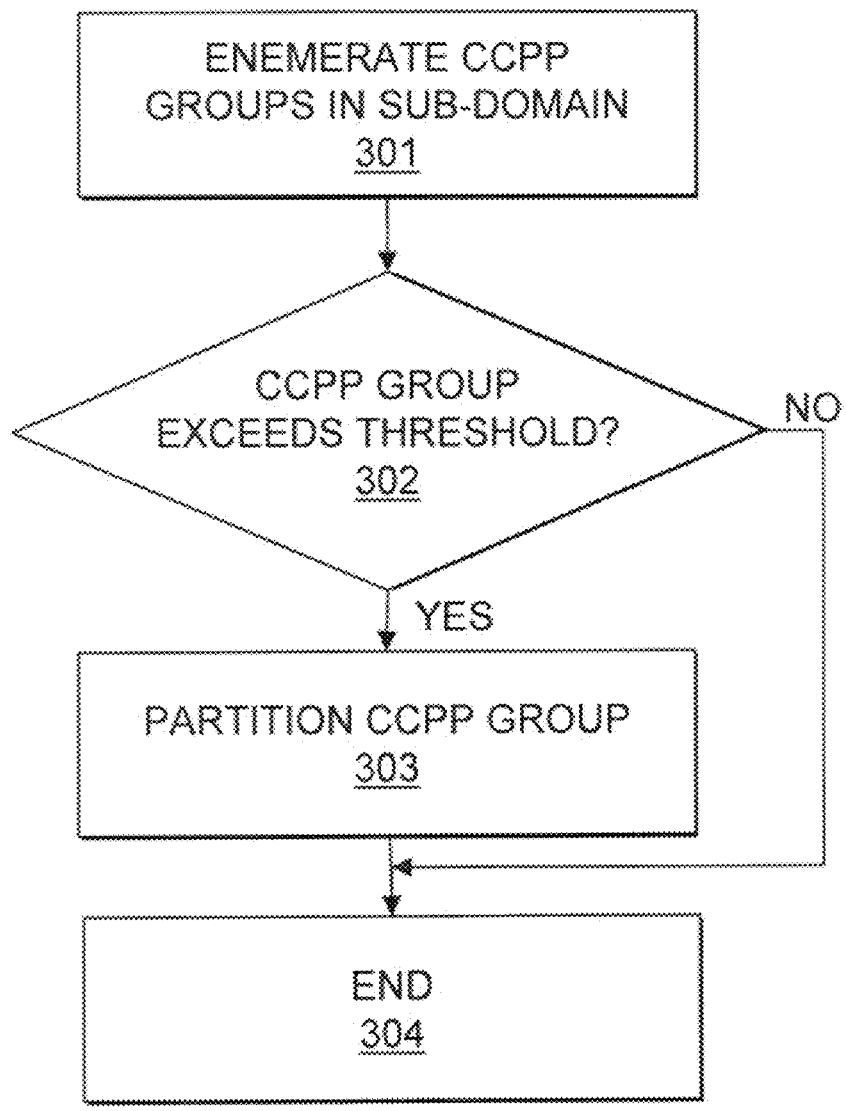
FIG. 3 is a flow chart illustrates a method for partitioning a sub-domain according to an embodiment of the present invention.

According to an embodiment of the present invention, the sub-domain groups may be further partitioned. FIG. 3 is a flow chart illustrating a method for partitioning a sub-domain group according to an embodiment of the present invention. At 301, CCPP groups from a sub-domain group are enumerated. According to an embodiment of the present invention, the CCPP groups are enumerated using one or more of the procedures previously discussed.

At 302, each of the CCPP groups is analyzed to determine whether its size exceeds a threshold. According to an embodiment of the present invention, the threshold may be a measurement value. Alternatively, the threshold may be a ratio that compares a size of a CCPP group to a size of the system or part of the system. If the size of a CCPP group exceeds the threshold, control proceeds to 303 to perform an appropriate procedure on the CCPP group that exceeds the threshold. If the sub-domain does not exceed the threshold, control proceeds to 304 and terminates the procedure for the CCPP group.

At 303, the CCPP group is partitioned into a plurality of siblings. According to an embodiment of the present invention, a random partition of the sub-domain destination registers is performed. For example, the partitioning may be based on register node-id as represented by the following relationship where N is a number of siblings.

SIBLING_GROUP(i)={register R such that
R·id( )mod N==i}

Figure 4:
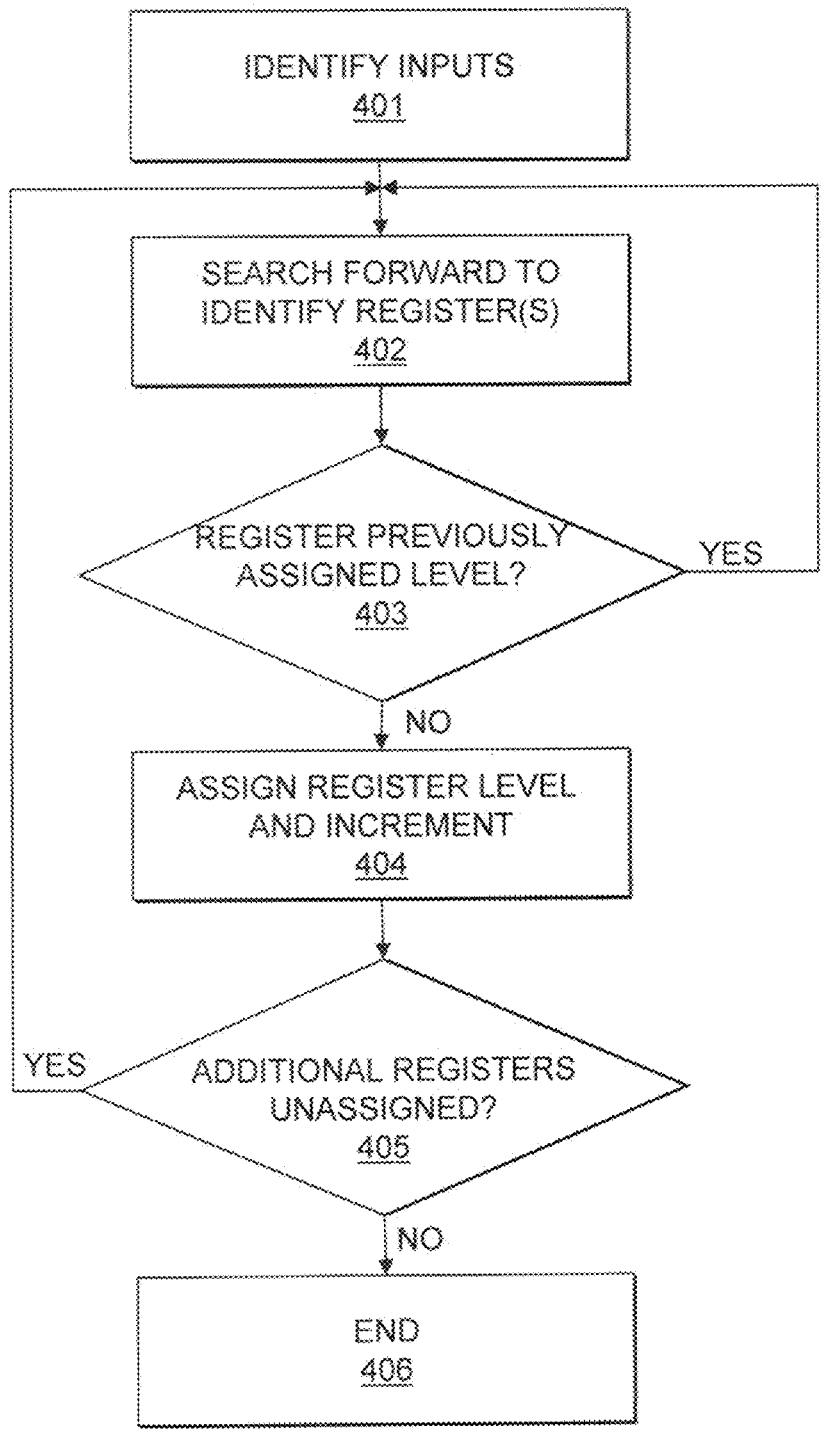
FIG. 4 is a flow chart illustrating a method for partitioning a sub-domain into hierarchical levels.

According to an alternate embodiment, partitioning may be based on sequential levels. FIG. 4 is a flow chart illustrating a method for partitioning a sub-domain into hierarchical levels. The procedure illustrated in FIG. 4 may be used to implement procedure 303 illustrated in FIG. 3. The procedure described with reference to FIG. 4 may be used to further partition CCPP groups from a sub-domain. At 401, inputs to the sub-domain are identified. The inputs are designated as starting points.

At 402, a forward search is performed from each previous point until registers are identified.

At 403, it is determined whether the registers identified have previously been assigned a level. If one of the registers had been previously assigned a level, control returns to 402 to continue a search forward until a register that had not been assigned a level is identified. If the register identified has not been previously assigned a level, control proceeds to 404.

At 404, the register(s) are assigned a level. According to an embodiment of the present invention, the first level assigned in the procedure is level one. Control increments the level number.

At 405, it is determined whether an additional register exists that has yet to be assigned a level. If an additional register exists, control returns to 402. If all register in the sub-domain have been assigned a level, control proceeds to 406 and terminates the procedure.

Figure 5:
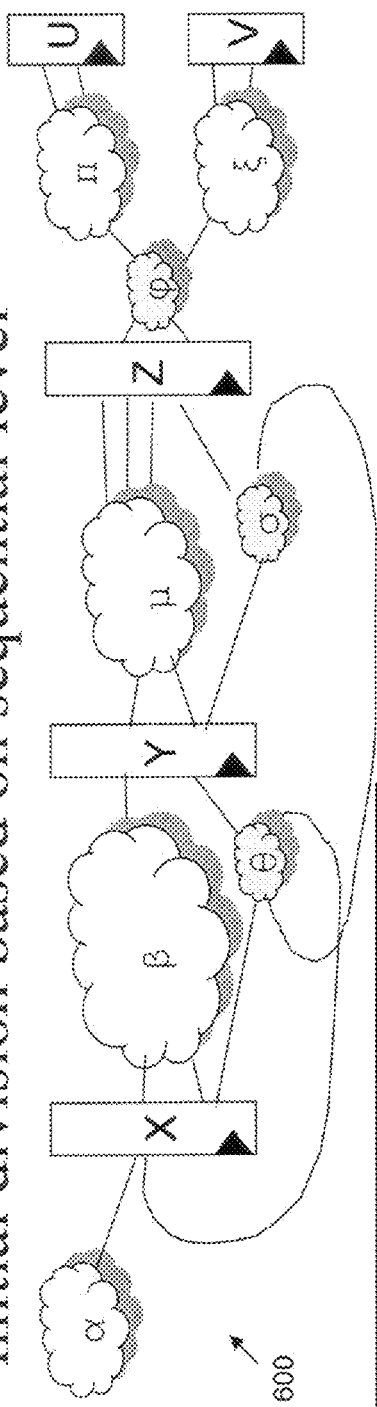
FIG. 5 illustrates an example of a sub-domain divided into sibling groups by sequential level using the procedure illustrated in FIG. 4 according to an embodiment of the present invention.

FIG. 5 illustrates a sub-domain that has been partitioned using the procedure described with reference to FIG. 4. The sub-domain 400 includes a source and destination clock that is the same and is divided into 4 sequential levels with register sets X, Y, Z and {U+V}. These sequential levels partition the combinatorial nodes into groupings shown in the accompanying table. Note that the combinational nodes in θ are included in both the sub-domain reachable from Y and also the sub-domain reachable from X and thus represent duplicate work. Similarly, the combinational nodes in σ and φ also represent duplicate work.

When duplicate work is small, the wall-clock benefit of the improved parallelization will likely result in an overall improvement processing time over a procedures which have idle threads waiting for active threads to complete a disproportionately large sub-graph.

Figure 6:
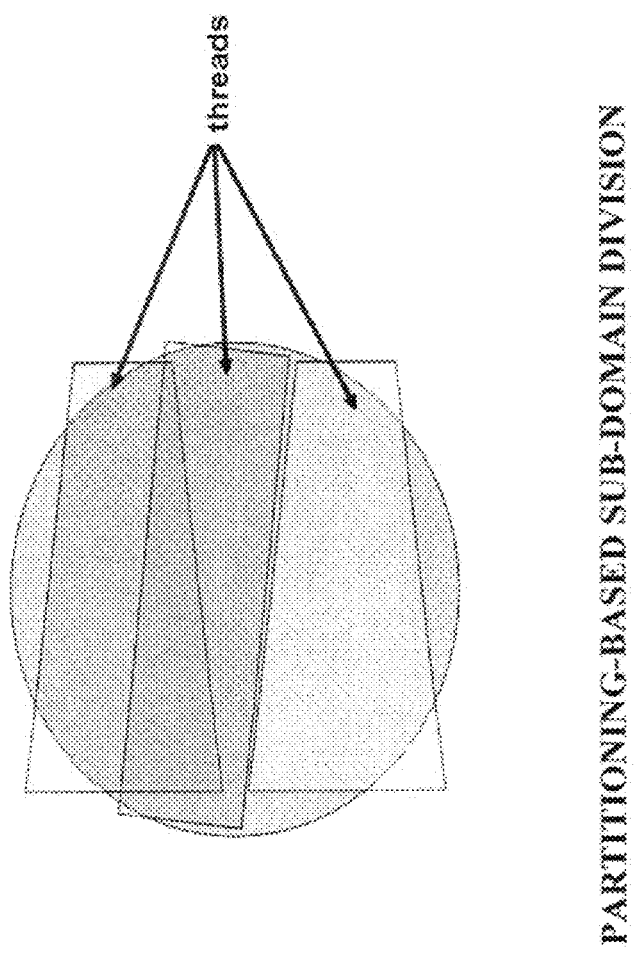
FIG. 6 illustrates an example of partitioning-based sub-domain division according to an embodiment of the present invention.

According to an alternative embodiment of the present invention, a sub-domain may be partitioned based on a number of combinational nodes. An example of this is illustrated in FIG. 6. FIG. 6 illustrates an example of partitioning-based sub-domain division according to an embodiment of the present invention. As shown, the endpoints or destination registers on the right side of the figure are non-overlapping. However, as the sibling groups look back in the graph to compute arrival times, they encounter some of the same nodes as indicated by overlap. When this occurs, threads compute the same values for the nodes in the overlapping triangle. This represents inefficiency since the same results will be obtained. However, because the goal of this procedure is to reduce the time to completion, minimal inefficiency is acceptable.

Algorithms for graph partitioning, min-cut graph partitioning, computing maximal fanout-free cones, and other procedures may be utilized. In another embodiment, partitioning may be performed by computing the maximum fanout-free cones from sink registers.

According to an embodiment of the present invention, results of previous sub-domain computation times and amount of duplicate work performed may be stored, allowing the algorithm to be adaptive over successive calls or executions. Sub-domain siblings which share more than a threshold amount of duplicate work may be merged to reduce overall work. Siblings which are smaller than expected are merged with other siblings and sub-domains which take longer to compute or include more nodes than expected may be further split.

When further partitioning sub-domains, procedures 201, 203-205, and 207 may be illustrated in part with the following pseudo code.

---

```
For each pos/neg destination clock domain
    For each source clock domain
        For each exception type
            Compute source & sink registers
            Compute_ccpp_groups( )
            For each CCPP_GROUP
                Partition destination registers
                  into sibling groups using
                  sequential levels as a heuristic
                  partition on the destination
                  registers
                For each sibling group
                    Queue a
                    SUBDOMAIN_DATA work-
                    order
```

```
      Wait for threads to complete.
      Perform appropriate merging of sub-domains into
         domain-slack, or passing on to the placement
         algorithm, as appropriate to the context used for
         this STA call.
      While the SUBDOMAIN_DATA queue is not empty
         Pop( ) a work-order from the work-queue.
         RESULT = Compute slack on the subdomain
             sibling (partial subdomain)
         Store RESULT in the RESULT_HASH
         Decrement sibling_count for this subdomain
         If subdomain is now complete (R is complete,
             meaning that the count of the number of
             siblings has gone to 0)
             Merge all siblings for this subdomain
             Store the resulting slacks to the
                subdomain structure
             Report edge slacks and total slack for
                this subdomain to caller
         Search RESULT_HASH for matching
             completed results
         If found
             Mark self complete, clean up memory,
                etc.
      Exit( )
```

According to an alternate embodiment of the present invention, instead of partitioning CCPP groups into hierarchical levels, sub-domains may be partitioned into hierarchical levels without partitioning the sub-domain to CCPP groups.

Referring back to FIG. 1, it should be appreciated that the procedure illustrated may be modified such that placement and timing analysis operate asynchronously. In a situation where multiple processor threads are not fully utilized by a placement procedure, timing analysis may be performed in parallel with placement.

This modified procedure may be illustrated with the following exemplary pseudo code.

```
      Initialize a "random" or "constructive" placement to optimize
      Call STA( ) to obtain slack on all netlist edges
      Make modifications to placement (e.g. move cells to new
         locations)
      While placement-criteria-not-met
         In parallel {
             Make further modifications to placement (e.g.
                move cells to new locations) using the
                existing edge slacks
             Call STA( ) to obtain slack on all netlist edges.
         }
```

This modified procedure is particularly useful when either the placement procedure or timing analysis procedure is unable to fully utilize available threads.

In an alternate embodiment of the present invention, the placement procedure may restrict moves or modifications to a single clock domain. Thus, the STA( ) can safely compute analysis on one clock domain while the placer works on a different clock domain. This approach is particularly attractive when performing physical synthesis and is illustrated with the following pseudo code.

```
      Starting with a "mostly good" placement
      Call STA( ) to obtain slack on all netlist edges and lists of
         relevant clock domains {D1, D2}
      While placement-criteria-not-met
```

```
         In parallel {
             Make small modifications to placement for cells
                in D1
             Call STA( ) to obtain slack on all netlist edges
                for cells in D2
         }
         In parallel {
             Make small modifications to placement for cells
                in D2
             Call STA( ) to obtain slack on all netlist edges
                for cells in D1
         }
```

The pseudo code illustrated presents an example where only two domains are addressed. It should be appreciated that embodiments of the present invention may schedule additional domains.

It should be appreciated that the placement and timing analysis procedures may be performed entirely asynchronously and communicate data using thread-safe, semaphore-protected queues. In this embodiment, the placement procedure may utilize multiple threads on several different domains. When a move is completed, a request for static timing analysis may be queued and the placement procedure may continue with another operation. The placement procedure may continue with another set of moves or check the static timing analysis return queue for new updates to the timing of the netlist.

FIGS. 1-4 are flow charts that illustrate embodiments of the present invention. Some of the techniques illustrated may be performed sequentially, in parallel or in an order other than that which is described and that the procedures described may be repeated. It should be appreciated that not all of the techniques described are required to be performed, that additional techniques may be added, and that some of the illustrated techniques may be substituted with other techniques.

Figure 7:
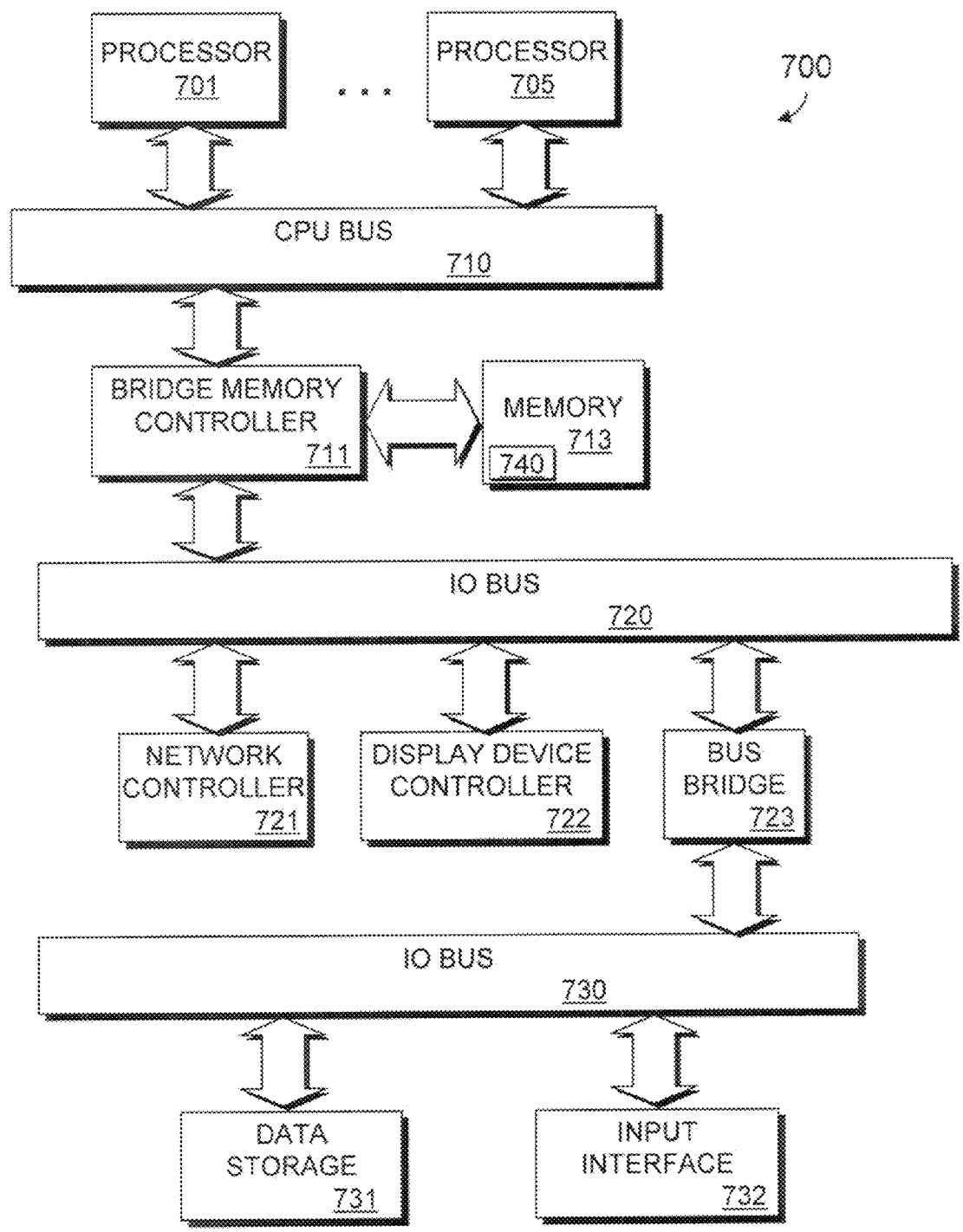
FIG. 7 is a block diagram that illustrates a computer system in which an exemplary embodiment of the invention resides.

FIG. 7 is a block diagram of an exemplary computer system 100 in which an example embodiment of the present invention resides. The computer system 700 includes one or more processors that process data signals. As shown, the computer system 700 includes a first processor 701 and an nth processor 705, where n may be any number. The processors 701 and 705 may be a complex instruction set computer microprocessor, a reduced instruction set computing microprocessor, a very long instruction word microprocessor, a processor implementing a combination of instruction sets, or other processor device. The processors 701 and 705 may be multi-core processors with multiple processor cores on each chip. Each of the processors 701 and 705 and each of the processor cores may support one or more hardware threads. The processors 701 and 705 are coupled to a CPU bus 710 that transmits data signals between processors 701 and 705 and other components in the computer system 700.

The computer system 700 includes a memory 713. The memory 713 may be a dynamic random access memory device, a static random access memory device, and/or other memory device. The memory 713 may store instructions and code represented by data signals that may be executed by the processor 701. A bridge memory controller 711 is coupled to the CPU bus 710 and the memory 713. The bridge memory controller 711 directs data signals between the processor 701, the memory 713, and other components in the computer system 700 and bridges the data signals between the CPU bus 710, the memory 713, and a first IO bus 720.

The first IO bus 720 may be a single bus or a combination of multiple buses. The first IO bus 720 provides communication links between components in the computer system 700. A network controller 721 is coupled to the first IO bus 720. The network controller 721 may link the computer system 700 to a network of computers (not shown) and supports communication among the machines. A display device controller 722 is coupled to the first IO bus 720. The display device controller 722 allows coupling of a display device (not shown) to the computer system 700 and acts as an interface between the display device and the computer system 700.

A second IO bus 730 may be a single bus or a combination of multiple buses. The second IO bus 730 provides communication links between components in the computer system 700. A data storage device 731 is coupled to the second IO bus 730. The data storage device 731 may be a hard disk drive, a floppy disk drive, a CD-ROM device, a flash memory device or other mass storage device. An input interface 732 is coupled to the second IO bus 730. The input interface 732 may be, for example, a keyboard and/or mouse controller or other input interface. The input interface 732 may be a dedicated device or can reside in another device such as a bus controller or other controller. The input interface 732 allows coupling of an input device to the computer system 700 and transmits data signals from an input device to the computer system 100. A bus bridge 723 couples the first IO bus 720 to the second IO bus 730. The bus bridge 723 operates to buffer and bridge data signals between the first IO bus 720 and the second IO bus 730. It should be appreciated that computer systems having a different architecture may also be used to implement the computer system 700.

A system designer 740 may reside in memory 713 and be executed by one or more of the processors 701 and 705. The system designer 740 may operate to synthesize a system, place the system on a target device, route the system, and compute slack values for the system, where the slack values are computed in parallel utilizing the plurality of threads supported by the processor 701 and 705. According to an embodiment of the present invention, the system designer 740 identifies domains, sub-domains, and sub-domain partitions to assign to the threads as chunks to process in parallel.

Figure 8:
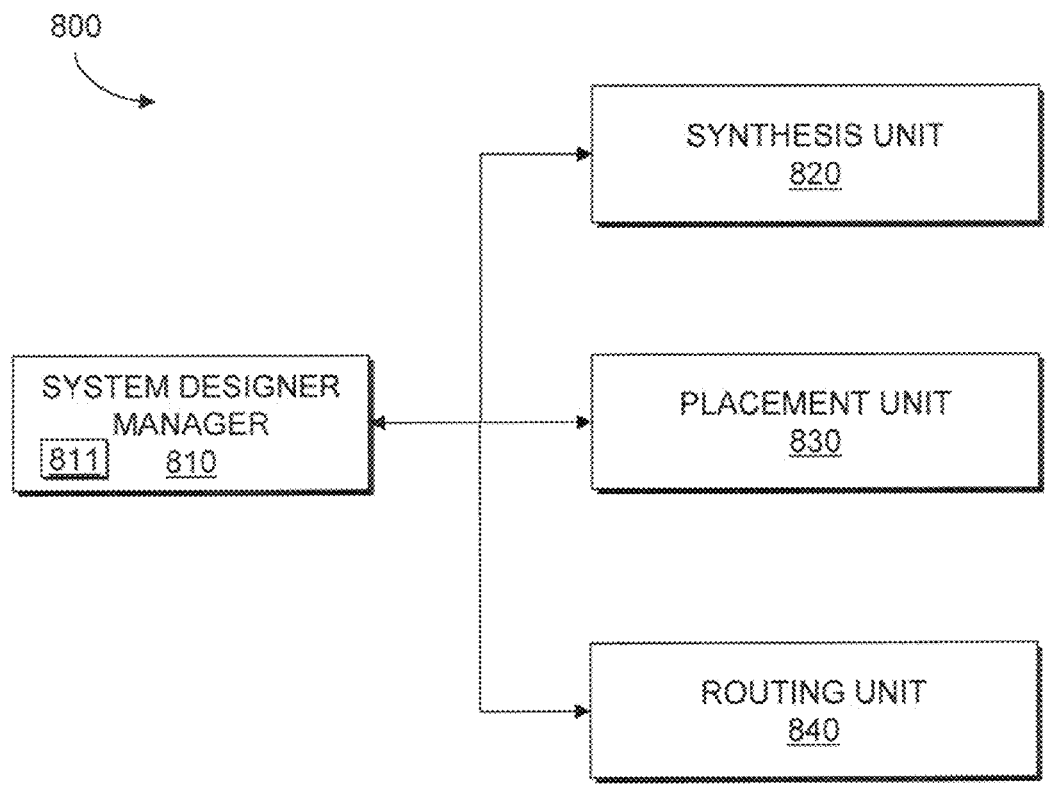
FIG. 8 illustrates a system designer according to an exemplary embodiment of the present invention.

FIG. 8 illustrates a system designer 800 according to an exemplary embodiment of the present invention. The system designer 800 may be used to implement the system designer 840 shown in FIG. 7. The system designer 800 may be an EDA tool for designing a system on a target device. The target device may be, for example, an application specific integrated circuit (ASIC), a structured ASIC, a field programmable gate array (FPGA), a programmable logic device (PLD), a printed circuit board (PCB), or other circuitry. FIG. 8 illustrates modules implementing an embodiment of the system designer 800. According to one embodiment, system design may be performed by a computer system (not shown) executing sequences of instructions represented by the modules shown in FIG. 8. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 800 includes a system designer manager 810. The system designer manager 810 is connected to and transmits data between the components of the system designer 800.

Block 820 represents a synthesis unit. The synthesis unit 820 generates a logic design of a system to be implemented in the target device. According to an embodiment of the system designer 800, the synthesis unit 820 takes a conceptual Hardware Description Language (HDL) design definition and generates an optimized logical representation of the system. The optimized logical representation of the system generated by the synthesis unit 820 may include a representation that has a minimized number of functional blocks and registers, such as logic gates and logic elements, required for the system. Alternatively, the optimized logical representation of the system generated by the synthesis unit 820 may include a representation that has a reduced depth of logic and that generates a lower signal propagation delay. The synthesis unit 820 also determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system. In an embodiment where the target device is a FPGA, the components could be logical elements or adaptive logic modules. In an embodiment where the target device is an ASIC, the components could be gates or standard cells. In an embodiment where the target device is a structured ASIC, the technology-mapped netlist may contain components that can be implemented in the structured ASIC fabric, such as RAM blocks, multiplier blocks, and gates from a library of gates.

Block 830 represents a placement unit. The placement unit 830 places the system on to the target device by determining which components or areas on the target device are to be used for specific functional blocks and registers. According to an embodiment of the system designer 800, the placement unit 830 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 830 may utilize a cost function in order to determine a good assignment of resources on the target device.

Block 840 represents a routing unit. The routing unit 850 determines the routing resources on the target device to use to provide interconnection between the components implementing functional blocks and registers of the logic design.

The system designer manager 810 includes a timing analysis unit 811. The timing analysis unit 811 computes the slack on various portions on the system. According to one embodiment, slack may refer to the difference between the data arrival time (including skew and microparameters) and the data required time. The data arrival time represents the time that a data signal arrives at a register's data input port. The data required time represents the time that takes the clock active edge to arrive at a destination register's clock port minus an intrinsic setup time of the register. The timing analysis unit 811 may also compute slack ratios which may be defined as 1-slack/setup-constraint for various portions on the system.

According to an embodiment of the system designer manager 810, the timing analysis unit 811 may compute slack and slack ratios after synthesis, placement, and/or routing in order to confirm that the design for the system meets timing requirements and to evaluate solutions generated by the synthesis unit 820, placement unit 830, and routing unit 840. The results generated from the timing analysis unit 811 may be used to re-run one or more of the procedures performed by the synthesis unit 820, placement unit 830, and/or routing unit 840 in efforts to improve a solution or be used by a physical synthesis unit (not shown) to perform physical synthesis on the system.

According to an embodiment of the system designer manager 810, the timing analysis unit 811 identifies domains, sub-domains, and partitions of sub-domains in the system and defines chunks from the domains, sub-domains, and partitions of sub-domains. The timing analysis unit 811 distributes the chunks to threads supported by the processors 701 and 705 (shown in FIG. 7) for parallel slack computation.

Figure 9:
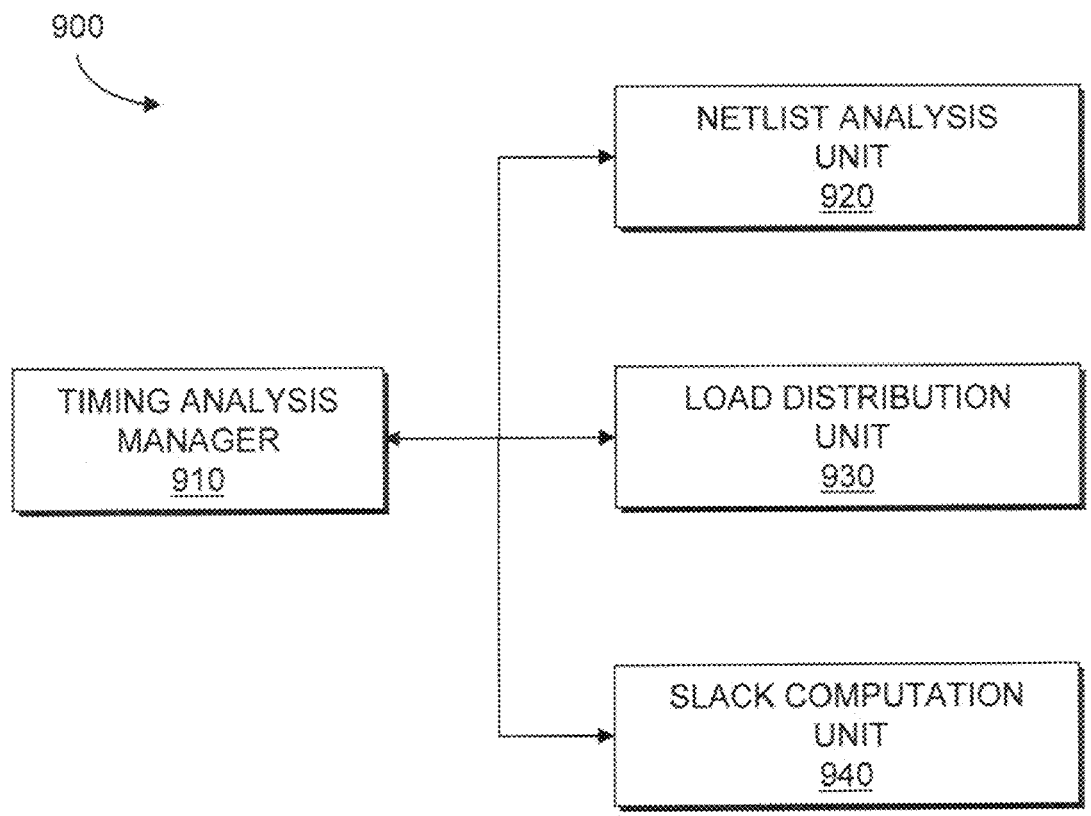
FIG. 9 is a block diagram of a timing analyzer unit according to an exemplary embodiment of the present invention.

FIG. 9 is a block diagram of a timing analysis unit 900 according to an exemplary embodiment of the present invention. The timing analysis unit 900 may be used to implement the timing analysis unit 911. The timing analysis unit 900 includes a timing analysis manager 910. The timing analysis manager 910 is connected to and transmits information between components in the timing analysis unit 900.

The timing analysis unit 900 includes a netlist analysis unit 920. The netlist analysis unit 920 parses a netlist and identifies domains and sub-domains in the netlist. The netlist may be one that is generated after synthesis, placement, or routing. According to an embodiment of the present invention, a domain may include a plurality of components (represented by nodes) and connections interconnecting the components that are driven by a single clock in a system. A sub-domain may include a path through a subset of the components and connections that are sourced by another domain. The sub-domain may include a subset of nodes and connections that are associated with a second clock. The sub-domain may also include a path through a subset of the nodes and connections that are subject to minimum and/or maximum delay constraints or that are not subject to any constraints (false path). According to an embodiment of the present invention, for false paths, the chunk does not need to be analyzed for slack computation. A timing exception may also occur for multicycle paths. For multicycle paths, delay constraints may be tightened or relaxed using a multiple of the source or destination clock period. It should be appreciated that a domain and sub-domain may be defined by other characteristics. If the size of a sub-domain identified exceeds a threshold, the sub-domain may be further partitioned. The partitioning of the sub-domain may involve partitioning the sub-domain into CCPP groups and sequential partitions (hierarchical levels) as described with respect to FIGS. 2-6, and/or in other manners.

The timing analysis unit 900 includes a load distribution unit 930. The load distribution unit 930 defines portions of the system ("chunks") to be separately processed by a thread. According to an embodiment of timing analysis unit 900, the load distribution unit 930 may define a chunk to include an entire domain and all sub-domains associated with it. Alternatively, the load distribution unit 930 may define a chunk to include only a sub-domain, or a partition of a sub-domain. The load distribution unit 930 may be programmed by a user of a system designer to select a definition of a chunk, or the load distribution unit 930 may be pre-programmed to make this definition.

The load distribution unit 930 may assign each available thread supported by a computer system to process one of the chunks identified so that slack computation for the chunks may be performed in parallel. According to an embodiment of the timing analysis unit 900, the load distribution unit 930 may perform the procedures listed below which are written in the form of pseudo code.

create a queue of chunks
    create n threads
    assign available thread to a chunk in queue
    for each thread, start processing chunk for slack
    while chunk exists in queue
        for each thread
            if thread is done
                add results to domain total
                assign thread to next chunk According to an embodiment of the load distribution unit 930, if it is determined that a chunk requires an amount of time to process that exceeds a threshold value, a number of additional procedures may be performed. According to one embodiment, if the chunk represents a domain, the chunk may be re-defined to form a plurality of chunks where each new chunk includes a sub-domain. This would allow the components of the domain to be processed in parallel. According to one embodiment, if the chunk represents a sub-domain, the chunk may be weighted for optimal scheduling. The optimal scheduling may involve scheduling processing of the chunk earlier in the schedule. If the chunk represents a partition of a sub-domain, the threshold level may be adjusted.

The timing analysis unit 900 includes a slack computation unit 940. The slack computation unit 940 computes slack for the chunks defined by the load distribution unit 930. According to an embodiment of the timing analysis unit 900, the slack computation unit 940 computes slack by performing two depth first searches. During the first depth first search, the slack computation unit 940 calculates data arrival times by adding the delays associated for each connection starting from the source nodes and ending at the destination nodes. During the second depth first search, the slack computation unit 940 calculates data required times by subtracting the delays associated for each connection starting from the destination nodes and ending at the source nodes. The slack is the computed as the difference between the data arrival and data required times. According to an embodiment of the present invention where each sub-domain in a system is associated with a separate chunk, there may be a plurality of slack values computed for a connection in the system. In this situation, the slack computation unit 940 may select a worst slack value to represent the slack for the connection. It should be appreciated that other procedures and techniques may be used by the slack computation unit 940 to compute slack. According to an embodiment of the present invention, the results generated from the slack computation unit 940 may be stored in a separate data structure outside a netlist.

Embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

FIG. 11 illustrates a target device according to an embodiment of the present invention. The target device 1000 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input lookup table (LUT) with a configurable register. According to an alternate embodiment of the present invention, the logic block may operate similarly to an adaptive logic module (ALM), such as those found in Stratix devices manufactured by Altera Corporation. LABs are grouped into rows and columns across the target device 1000. Columns of LABs are shown as 1011-1016. It should be appreciated that the logic block may include additional or alternate components.

The target device 1000 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 1000. Columns of memory blocks are shown as 1021-1024.

The target device 1000 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 1000 and are shown as 1031.

The target device 1000 includes a plurality of input/output elements (IOEs) 1040. Each IOE feeds an IO pin (not shown) on the target device 1000. The IOEs 1040 are located at the end of LAB rows and columns around the periphery of the target device 1000. Each IOE may include a bidirectional IO buffer and a plurality of registers for registering input, output, and output-enable signals.

The target device 1000 may include routing resources such as LAB local interconnect lines, row interconnect lines ("H-type wires"), and column interconnect lines ("V-type wires") (not shown) to route signals between components on the target device.

Figure 10:
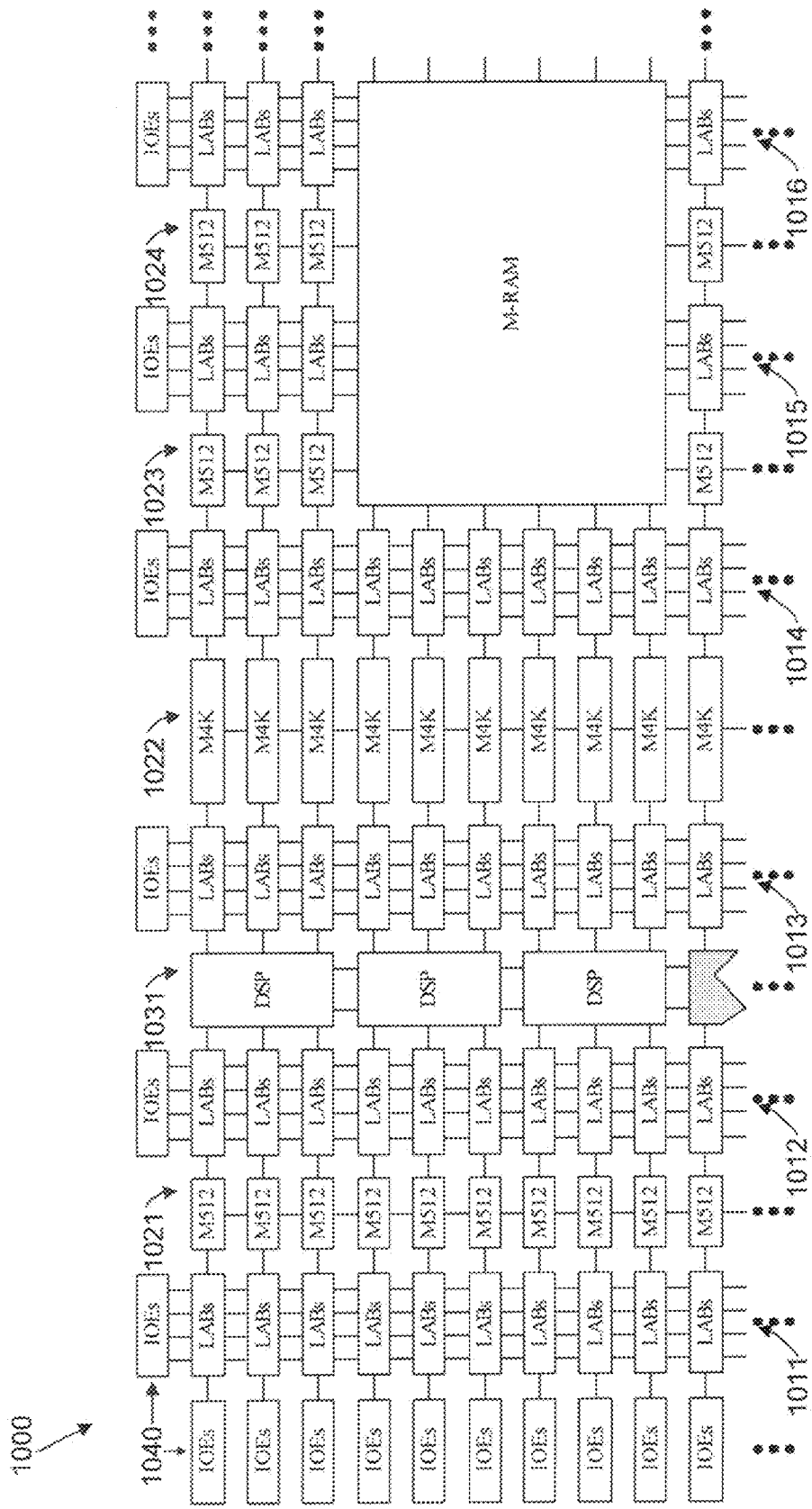
FIG. 10 illustrates a target device according to an exemplary embodiment of the present invention.

FIG. 10 illustrates an exemplary embodiment of a target device. It should also be appreciated that, as indicated above, the target device may include the same or different semiconductor devices arranged in a different manner. The target device 1000 may also include FPGA resources other than those described and illustrated with reference to the target device illustrated in FIG. 10. Thus, while embodiments of the invention described herein may be utilized on the architecture described in FIG. 10, it should be appreciated that it may also be utilized on different architectures.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
identifying domains and sub-domains in the system;
generating a plurality of chunks by dividing at least one sub-domain of the sub-domains if a size of the at least one sub-domain exceeds a threshold level; and
computing slacks for the plurality of chunks in parallel, wherein at least one of the identifying, dividing, and computing is performed by a processor.

2. The method of claim 1, wherein dividing the at least one sub-domain comprises dividing the at least one sub-domain into common clock path pessimism (CCPP) groups.

3. The method of claim 2, wherein dividing the at least one sub-domain into CCPP groups comprises using a linear enumeration method.

4. The method of claim 2, wherein dividing the at least one sub-domain into CCPP groups comprises using a N*log N enumeration method.

5. The method of claim 2, further comprising dividing a CCPP group into a plurality of hierarchical levels if the CCPP group exceeds a threshold level.

6. The method of claim 5, wherein the threshold level is a value.

7. The method of claim 5, wherein the threshold level is a ratio of the CCPP group size to a size of the system.

8. The method of claim 1, wherein dividing the at least one sub-domain comprises partitioning destination registers into hierarchical levels.

9. The method of claim 8, wherein partitioning destination registers into hierarchical levels comprises:
search forward from inputs until first registers are found;
assign a first level to the first registers found;
search forward from the first registers until second registers not assigned to a level are found;
assign a second level to the second registers; and
searching for additional registers until all the registers in the sub-domain have been assigned a level.

10. The method of claim 1, wherein identifying the domains comprises identifying a set of nodes in a netlist, that are associated with components in the system, and connections interconnecting the components that are driven by a clock in the system.

11. The method of claim 1, wherein identifying the sub-domains comprises identifying a path through a subset of nodes and connections associated with a first domain that are connected to one or more nodes sourced by another domain.

12. The method of claim 1, wherein identifying the sub-domains comprises identifying a path through a subset of nodes and connections associated with a first clock that are connected to one or more nodes associated with a second clock.

13. The method of claim 1, wherein identifying the sub-domains comprises identifying a path through a subset of nodes and connections that include at least one of a minimum and maximum delay constraint.

14. The method of claim 1, wherein identifying the sub-domains comprise identifying a path through a subset of the nodes and connections that is a false path.

15. The method of claim 1, wherein computing the slacks for the chunks in parallel comprises assigning a separate thread to process each chunk of the plurality of chunks.

16. The method of claim 1 further comprising:
synthesizing the system;
placing the system on the target device; and
routing the system, wherein the slacks are computed after one of the synthesizing, placing, and routing procedures.

17. The method of claim 16 further comprising revising one of the synthesizing, placing, and routing procedures in response to the slacks computed.

18. The method of claim 1 further comprising:
identifying chunks with duplicate edge slacks; and
merging the duplicate edge slacks, wherein a single slack value is stored for an edge with duplicate edge slacks.

19. The method of claim 1 further comprising:
identifying chunks where more than one slack value is assigned to an edge; and
merging the slacks such that a worse slack value for the edge is stored.

20. A non-transitory computer-readable medium including sequences of instructions stored thereon for causing a computer to execute a method comprising:
identifying domains and sub-domains in a system;
dividing a sub-domain into a plurality of chunks if a size of the sub-domain exceeds a threshold level; and
computing slacks for the chunks in parallel.

21. The non-transitory computer-readable medium of claim 20, wherein dividing the sub-domain into a plurality of chunks comprises dividing the sub-domain into common clock path pessimism (CCPP) groups.

22. The non-transitory computer-readable medium of claim 21, wherein the method further comprises dividing a CCPP group of the CCPP groups into a plurality of hierarchical levels if the CCPP group exceeds a threshold level.

23. The non-transitory computer-readable medium of claim 20, wherein dividing the sub-domain into a plurality of chunks comprises partitioning destination registers into hierarchical levels.

24. The non-transitory computer-readable medium of claim 20, wherein the threshold level is a value.

25. The non-transitory computer-readable medium of claim 20, wherein the threshold level is a ratio of the of the sub-domain to a size of the system.

26. The non-transitory computer-readable medium of claim 20, wherein the method further comprises modifying the threshold level in response to sizes of sub-domains in order to improve scheduling.

27. The non-transitory computer-readable medium of claim 20, wherein the method further comprises performing one of placement and physical synthesis on the sub-domain after slacks for the chunks of the sub-domain are computed while another available thread is computing slack for another sub-domain.

28. A system designer, comprising:
a synthesis unit operable to synthesize a system;
a placement unit operable to place the system on a target device;
a routing unit operable to route the system; and
a timing analysis unit operable to divide a sub-domain in the system into a plurality of chunks if a size of the sub-domain exceeds a threshold level and operable to compute slacks for the chunks in parallel.

29. The system designer of claim 28, wherein the timing analysis unit comprises:
a netlist analyzer unit operable to partition the sub-domain into partitions in response to determining that the sub-domain exceeds a threshold value; and
a load distribution unit operable to define chunks from the partitions of the sub-domain.

30. The system designer of claim 29, wherein the load distribution unit is operable to assigns the chunks to threads to compute slacks in parallel.

31. The system designer of claim 28, further comprising a slack computation unit operable to compute slack by performing a depth first search of the system.

32. The system designer of claim 28, wherein partitioning the destination registers into hierarchical levels comprises:
searching forward from inputs until first registers are found;
assigning a first level to the first registers found;
searching forward from the first registers until second registers unassigned to a level are found;
assigning a second level to the second registers; and
searching for additional registers until all the registers in the sub-domain have been assigned a level.

* * * * *